Aug. 25, 1959 H. MEGARD 2,901,600

TELEVISION SET ADAPTED TO RECEIVE TWO DEFINITIONS

Filed Oct. 22, 1954

Inventor:
Henry MEGARD
by J. [signature]
Attorney

United States Patent Office 2,901,600

Patented Aug. 25, 1959

2,901,600

TELEVISION SET ADAPTED TO RECEIVE TWO DEFINITIONS

Henry Megard, Geneva, Switzerland, assignor to Sautier & Jaeger, Geneva, Switzerland, a firm of Switzerland Application October 22, 1954, Serial No. 464,146

Claims priority, application Switzerland October 23, 1953

2 Claims. (Cl. 250—20)

It is a well known fact that according to the definition which has been adopted, a television transmission occupies a more or less wide range of frequencies (e.g. 7 mc./s. for 625 lines and 11 mc./s. for the French standard 819 lines).

Consequently, it is necessary to provide inside a superheterodyne set a frequency band for intermediate frequencies such that the higher definition may be received by it in addition to the lower definition.

However this manner of operating leads to serious drawbacks when it is desired to receive a transmission of a lower definition and the space occupied by which is smaller, by reason of the risk of jamming by an adjacent station producing as a result of a local oscillation intermediate frequency beats in the portion of the intermediate frequency range which is not being used.

My invention has for its object to cut out these drawbacks and is has more specifically for its object a method for adjusting the frequency range used for amplification in an intermediate frequency television chain with a view to providing the reception of transmissions made on various definitions.

My improved method consists in that I use at least for the connection between the frequency changer and the first intermediate frequency stage a tightly-coupled transformer tuned to the limit frequencies of the smaller frequency range while I insert in the anode circuit of at least one of the following stages a tuning circuit including a resistance, an inductance and two adjustable condensers inserted in series and of which one provides for the tuning of the circuit to the medial frequency of said smaller frequency range corresponding to lower definitions while the other is operative only for the reception of high definition television signals, said second condenser widening the frequency range transmitted by said intermediate frequency chain through a modification in the tuning of the above mentioned tuning circuit.

My invention has also for its object a television receiving set incorporating means for the execution of the above method. My improved superheterodyne television set includes means for connecting the frequency changing tube with the first stage of the intermediate frequency chain through a transformer the tightly coupled windings of which are tuned to the limit frequencies of the narrower frequency range while at least one of the following intermediate frequency stages includes in its anode circuit a tuning circuit of the above disclosed type equipped with two adjustable condensers inserted in series, of which the first condenser is adapted to produce the tuning of said circuit to the medial frequency of said narrower frequency range while the second condenser is inserted in series with the first condenser through the agency of a switch and the second tuning produced by the capacitive resultant of the series arrangement of the two condensers is such that it produces a widening towards the upper frequencies of the frequency range transmitted by the intermediate frequency stage.

Accompanying drawing illustrates by way of example the two first stages of the intermediate frequency chain of a preferred embodiment of a receiver set according to my invention, together with explanatory graphs. In said drawings.

Figure 1:
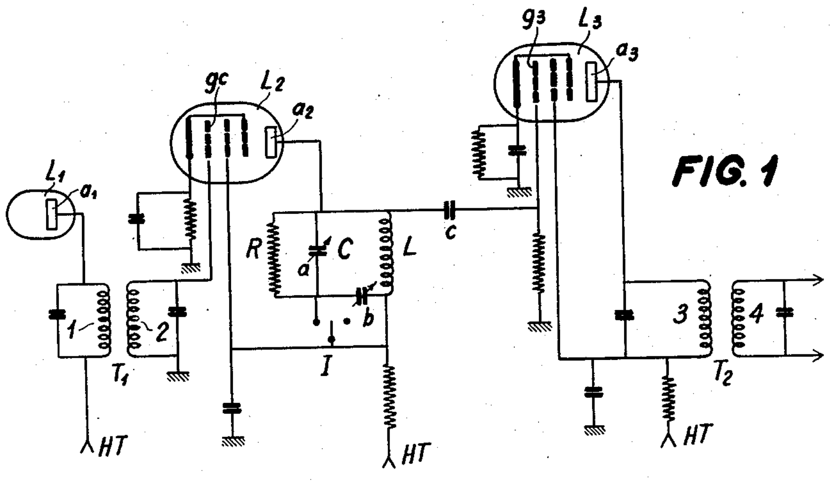
Fig. 1 is a wiring diagram.

In the example illustrated in Fig. 1 the anode *a*1 of the frequency changing tube L1 is connected through a transformer T1 with the grid *gc* of a pentode L2 forming part of the first stage of an intermediate frequency amplifying chain.

The primary and secondary windings 1 and 2 of the transformer T1 form part of tightly-coupled tuning circuits.

The tightly-coupled circuit including the primary 1 is tuned for instance to frequencies ranging between 27 and 34 mc./s. with a frequency range of 7 mc./s. corresponding to the band used for the low definition transmissions.

The anode *a*2 of the pentode L2 is connected through a capacity *c* with the grid *g*3 of a second pentode L3 the anode circuit *a*3 of which includes a primary tuning circuit 3 which is magnetically tightly-coupled with a secondary circuit 4. These circuits 3 and 4 form a second transformer T2 similar to the transformer T1.

The anode circuit *a*2 of the pentode L2 includes a tuning circuit including a resistance and an inductance and adapted to widen the frequency range and which includes two adjustable condensers inserted in series, *a* and *b*, the capacities of which are very different. The condenser *b* of a large capacity and having consequently a small reactance with reference to the condenser *a*, may be short-circuited by a two-position switch I.

For the left-hand position of the switch I shown in Fig. 1, the condenser *a* is alone operative and it is possible to adjust it so as to tune the tuning circuit to a frequency of 30.5 mc./s. intermediate between the above-mentioned frequency values: 27 and 34 mc./s. The transformers T1 and T2 thus form amplifier circuits of the narrow frequency range the breadth of which is 7 mc./s.

Figure 2:
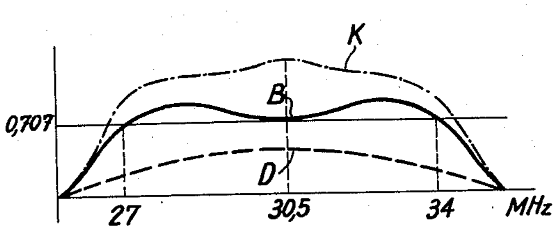
Fig. 2 is a graph of the frequencies transmitted by the tightly-coupled transformers.

The tightly-coupled transformer circuits 1—2 and 3—4 produce, when considered alone, a frequency range B (Fig. 2) with two peaks, but, as the tuning circuit is tuned to 30.5 mc./s., there is produced as shown by the curve D of Fig. 2, drawn in interrupted lines, a reinforcement of the frequency range so that the resultant curve is that illustrated at K in dot-and-dash lines.

Figure 3:
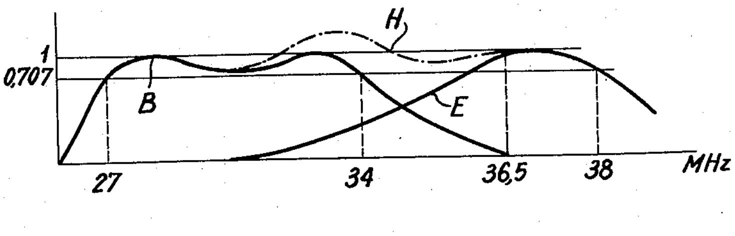
Fig. 3 is a graph showing the widening of the frequency range for high definitions.

When the switch I is open, the padding condenser *b* is adjusted so as to provide a tuning of the circuit RLC to a frequency of 36.5 mc./s., which has for its result to widen the frequency range to 11 mc./s. (see Fig. 3). The resultant curve H has ordinates that are substantially equal to the sum of the ordinates of the component curve B obtained as precedingly by means of the tightly-coupled circuits 1—2 and 3—4 respectively and of the component curve E produced by the widening of the frequency range as obtained by the tuning of the tuning circuit to 36.5 mc./s. Obviously it is possible to provide more than two intermediate frequency stages with transformers such as T1 and T2 having tightly-coupled windings and to insert tuning circuits of the type described with an auxiliary adjustable condenser in several stages of the intermediate frequency chain of the receiver set.

What I claim is:

1. An intermediate frequency amplifying stage of a television set adapted to receive selectively low and high definition transmissions respectively within a narrow frequency range and within a broader range constituted by the narrower range and an extension thereof towards higher frequency values, said stage including a frequency changing tube, a chain of intermediate frequency tubes, two tightly coupled transformers permanently tuned to the limit frequencies of the narrow frequency range and inserted respectively between the frequency changing tube and the first tube of the intermediate frequency chain and between two successive tubes of said intermediate frequency chain and a tuning circuit inserted in the anode circuit of one of the intermediate frequency tubes ahead of the second transformer, including a resistance, an inductance and two condensers and means for short-circuiting one of said condensers, said tuning circuit being coupled with the control grid of the next intermediate frequency tube, said circuit being tuned selectively to the medial frequency of the narrower frequency range and of the extension thereof according as to whether said condenser short-circuiting means are closed or open to obtain in the second case transmission of the entire broader frequency range under substantially unvarying amplification conditions.

2. An intermediate frequency amplifying stage of a television set adapted to receive selectively low and high definition transmissions respectively within a narrow frequency range and within a broader range constituted by the narrower range and an extension thereof towards higher frequency values, said stage including a frequency changing tube, a chain of intermediate frequency tubes, two tightly coupled transformers permanently tuned to the limit frequencies of the narrow frequency range and inserted respectively between the frequency changing tube and the first tube of the intermediate frequency chain and between two successive tubes of said intermediate frequency chain and a tuning circuit inserted in the anode circuit of one of the intermediate frequency tubes ahead of the second transformer, including a resistance, an inductance and two condensers of greatly different capacities and means for short-circuiting the larger capacity condenser, said tuning circuit being coupled with the control grid of the next intermediate frequency tube, said circuit being tuned selectively to the medial frequency of the narrower frequency range and of the extension thereof according as to whether said condenser short-circuiting means are closed or open to obtain in the second case transmission of the entire broader frequency range.

References Cited in the file of this patent

UNITED STATES PATENTS

| | | |
|---|---|---|
| 2,122,257 | Laughlin et al. | June 28, 1938 |
| 2,254,855 | Poch | Sept. 2, 1941 |
| 2,464,125 | Fisher | Mar. 8, 1949 |
| 2,586,576 | Stigter | Feb. 19, 1952 |

FOREIGN PATENTS

| | | |
|---|---|---|
| 662,875 | Germany | July 23, 1938 |